(12) United States Patent
Harari et al.

(10) Patent No.: US 11,335,693 B2
(45) Date of Patent: May 17, 2022

(54) 3-DIMENSIONAL NOR STRINGS WITH SEGMENTED SHARED SOURCE REGIONS

(71) Applicant: Sunrise Memory Corporation, Fremont, CA (US)

(72) Inventors: Eli Harari, Saratoga, CA (US); Raul Adrian Cernea, Santa Clara, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/170,664

(22) Filed: Feb. 8, 2021

(65) Prior Publication Data

US 2021/0233926 A1 Jul. 29, 2021

Related U.S. Application Data

(60) Continuation of application No. 16/792,808, filed on Feb. 17, 2020, now Pat. No. 10,950,616, which is a
(Continued)

(51) Int. Cl.
*G11C 7/18* (2006.01)
*H01L 27/11* (2006.01)
(Continued)

(52) U.S. Cl.
CPC .......... *H01L 27/11578* (2013.01); *G11C 7/18* (2013.01); *G11C 16/0466* (2013.01);
(Continued)

(58) Field of Classification Search
None
See application file for complete search history.

(56) References Cited

U.S. PATENT DOCUMENTS

| 5,583,808 A | 12/1996 | Brahmbhatt |
| 5,646,886 A | 7/1997 | Brahmbhatt |

(Continued)

FOREIGN PATENT DOCUMENTS

| KR | 20120085591 A1 | 8/2012 |
| WO | 2018236937 A1 | 12/2018 |

OTHER PUBLICATIONS

"EP Extended Search Report EP168690149.3", dated Oct. 18, 2019.
(Continued)

*Primary Examiner* — Tan T. Nguyen
(74) *Attorney, Agent, or Firm* — Edward C. Kwok; VLP Law Group, LLP

(57) ABSTRACT

A NOR string includes a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

11 Claims, 4 Drawing Sheets

Related U.S. Application Data division of application No. 16/006,612, filed on Jun. 12, 2018, now Pat. No. 10,608,008.

(60) Provisional application No. 62/522,665, filed on Jun. 20, 2017.

(51) Int. Cl.
  *H01L 27/11578* (2017.01)
  *H03K 19/20* (2006.01)
  *H03K 19/1776* (2020.01)
  *G11C 16/04* (2006.01)
  *G11C 16/08* (2006.01)
  *G11C 16/24* (2006.01)
  *H01L 29/786* (2006.01)

(52) U.S. Cl.
  CPC .............. *G11C 16/08* (2013.01); *G11C 16/24* (2013.01); *H03K 19/1776* (2013.01); *H03K 19/20* (2013.01); *H01L 29/78696* (2013.01)

(56) References Cited

U.S. PATENT DOCUMENTS

| | | |
|---|---|---|
| 5,656,842 A | 8/1997 | Iwamatsu |
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,107,133 A | 8/2000 | Furukawa et al. |
| 6,118,171 A | 9/2000 | Davies et al. |
| 6,130,838 A | 10/2000 | Kim et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,946,703 B2 | 9/2005 | Ryu et al. |
| 7,005,350 B2 | 2/2006 | Walker et al. |
| 7,307,308 B2 | 12/2007 | Lee |
| 7,489,002 B2 | 2/2009 | Forbes et al. |
| 7,524,725 B2 | 4/2009 | Chung |
| 7,612,411 B2 | 11/2009 | Walker |
| 8,026,521 B1 | 9/2011 | Or-Bach et al. |
| 8,139,418 B2 | 3/2012 | Carman |
| 8,178,396 B2 | 5/2012 | Sinha et al. |
| 8,630,114 B2 | 1/2014 | Lue |
| 8,767,473 B2 | 7/2014 | Shim et al. |
| 8,848,425 B2 | 9/2014 | Schloss |
| 8,878,278 B2 | 11/2014 | Alsmeier et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,412,752 B1 | 8/2016 | Yeh et al. |
| 9,748,172 B2 | 8/2017 | Takaki |
| 9,842,651 B2 | 12/2017 | Harari |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari |
| 10,249,370 B2 | 4/2019 | Harari |
| 10,254,968 B1 | 4/2019 | Gazit et al. |
| 10,373,956 B2 | 8/2019 | Gupta et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,608,008 B2* | 3/2020 | Harari ................... H03K 19/20 |
| 10,622,377 B2 | 4/2020 | Harari et al. |
| 10,692,874 B2 | 6/2020 | Harari et al. |
| 10,950,616 B2* | 3/2021 | Harari ................. H03K 19/1776 |
| 2001/0030340 A1 | 10/2001 | Fujiwara |
| 2001/0053092 A1 | 12/2001 | Kosaka et al. |
| 2002/0028541 A1 | 3/2002 | Lee et al. |
| 2002/0051378 A1 | 5/2002 | Ohsawa |
| 2002/0193484 A1 | 12/2002 | Albee |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2005/0128815 A1 | 6/2005 | Ishikawa et al. |
| 2005/0280061 A1 | 12/2005 | Lee |
| 2006/0155921 A1 | 7/2006 | Gorobets et al. |
| 2008/0239812 A1 | 10/2008 | Naofumi et al. |
| 2008/0291723 A1* | 11/2008 | Wang ................. G11C 16/3409 365/185.3 |
| 2008/0301359 A1 | 12/2008 | Smith et al. |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0316487 A1 | 12/2009 | Lee et al. |
| 2010/0124116 A1 | 5/2010 | Takashi et al. |
| 2010/0128509 A1 | 5/2010 | Kim et al. |
| 2011/0044113 A1 | 2/2011 | Kim et al. |
| 2011/0115011 A1 | 5/2011 | Masuoka et al. |
| 2011/0208905 A1 | 8/2011 | Shaeffer et al. |
| 2011/0298013 A1 | 12/2011 | Hwang et al. |
| 2012/0063223 A1* | 3/2012 | Lee .................... G11C 16/0433 365/185.02 |
| 2012/0182801 A1 | 7/2012 | Lue |
| 2012/0243314 A1 | 9/2012 | Takashi |
| 2012/0307568 A1 | 12/2012 | Banna et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0117366 A1 | 5/2014 | Saitoh |
| 2014/0151774 A1 | 6/2014 | Rhie |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0098272 A1 | 4/2015 | Kasorla et al. |
| 2015/0194440 A1 | 7/2015 | Noh et al. |
| 2015/0249143 A1 | 9/2015 | Sano |
| 2016/0019951 A1 | 1/2016 | Park et al. |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0358594 A1 | 12/2017 | Lu et al. |
| 2018/0108416 A1 | 4/2018 | Harari |
| 2018/0269229 A1 | 9/2018 | Or-Bach et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0157296 A1 | 5/2019 | Harari et al. |
| 2019/0180821 A1 | 6/2019 | Harari |
| 2019/0206890 A1 | 7/2019 | Harari et al. |
| 2019/0244971 A1 | 8/2019 | Harari |
| 2019/0259769 A1 | 8/2019 | Karda et al. |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0258897 A1 | 8/2020 | Yan et al. |

OTHER PUBLICATIONS

"European Search Report, EP 16852238.1", dated Mar. 28, 2019.
"European Search Report, EP17844550.8", dated Aug. 12, 2020, 11 pages.

(56) References Cited

OTHER PUBLICATIONS

"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052446", dated Dec. 11, 2019.
Kim, N., et al., "Multi-layered Vertical gate NANO Flash Overcoming Stacking Limit for Terabit Density Storage", Symposium on VLSI Tech Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

\* cited by examiner

3-DIMENSIONAL NOR STRINGS WITH SEGMENTED SHARED SOURCE REGIONS

CROSS REFERENCES TO RELATED APPLICATIONS

This application is a continuation of U.S. patent application ("Non-provisional application"), Ser. No. 16/792,808, entitled "3-Dimensional NOR Strings with Segmented Shared Source Regions," filed on Feb. 17, 2020, which is a divisional application of U.S. non-provisional application Ser. No. 16/006,612, entitled "3-Dimensional NOR Strings with Segmented Shared Source Regions," filed on Jun. 12, 2018, now U.S. Pat. No. 10,608,008, which is related to and claims priority of U.S. provisional patent application ("Provisional Application"), Ser. No. 62/522,665, entitled "3-Dimensional NOR Strings with Segmented Shared Source Regions," filed Jun. 20, 2017. This application is also related to copending U.S. patent application ("Copending Non-provisional application"), Ser. No. 15/248,420, entitled "Capacitive-Coupled Non-Volatile Thin-film Transistor Strings in Three-Dimensional Arrays," filed Aug. 26, 2016 and now published as U.S. 2017/0092371. The Provisional Application and the Copending Non-provisional application are hereby incorporated by reference in their entireties. References to the Copending Non-provisional application herein are made by paragraph numbers of the publication.

BACKGROUND OF THE INVENTION

1. Field of the Invention

The present invention relates to non-volatile NOR-type memory strings. In particular, the present invention relates to 3-dimensional semiconductor structures including arrays of non-volatile NOR-type memory strings.

2. Discussion of the Related Art

The Copending Non-provisional application discloses a 3-dimensional array of memory transistors organized as NOR strings in a semiconductor structure. Each such NOR strings includes a large number of individually addressable thin-film storage transistors ("TFTs") sharing a common or shared drain region and a common or shared source region, As discussed in paragraph [0159] of the Copending Non-provisional application, when a TFT in a NOR string is addressed and read, the cumulative off-state source-drain leakage current due to the large number of other TFTs (e.g., thousands) in the NOR string may interfere with the read current of the addressed TFT. To avoid such a large leakage current, one may consider having a shorter NOR string (i.e., a NOR string with fewer TFTs). However, for a given number of TFTs in an array of memory strings, a lesser number of TFTs in each NOR string results in a greater total number of sense amplifiers and string decoders required in the array, thereby increasing the chip cost.

SUMMARY

According to one embodiment of the present invention, a NOR string includes: a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

A NOR string of the present invention may further include a conductive sublayer provided adjacent the first semiconductor sublayer to provide a low-resistivity path in the shared bit line, which may be selectively electrically connected to circuitry formed in the semiconductor substrate.

A NOR string of the present invention may be one of a number of like NOR strings formed one on top of another in a stack of active strips. The stack of active strips may, in turn, be part of a number of like stacks of active strips organized as an array of NOR strings.

Within each segment in a NOR string of the present invention, one or more pre-charge transistors may be provided to connect the shared bit line and the corresponding source line segment.

According to one embodiment of the present invention, a process for forming a memory structure includes: (i) forming circuitry in a semiconductor substrate, the semiconductor substrate having a planar surface; (ii) forming multiple active layers, with successive active layers being isolated from each other by isolation layers, each active layer comprising first and second semiconductor sublayers of a first conductivity type, a third semiconductor layer of a second conductivity type opposite the first conductivity type; (iii) patterning and etching the active layers anisotropically to form a first system of trenches from the top of the active layers along a first direction substantially perpendicular to the planar surface, such that each trench extends lengthwise along a second direction substantially parallel to the planar surface; (iv) filling the first set of trenches with a sacrificial material; (v) patterning and etching the sacrificial material anisotropically along the first direction to form a second set of trenches running lengthwise along a third direction substantially parallel the planar surface and substantially orthogonal to the second direction, thereby exposing a portion of each of the plurality of active layers; and (vi) isotropically etching the exposed portions of the active layers to remove exposed portions of the first, second and third semiconductor sublayers of each active layer.

In one embodiment, a process of the present invention provides, in each active layer, a conductive layer adjacent the first semiconductor sublayer that is resistant to the isotropically etching step.

Subsequent to the isotropically etching step, the process may further include: (i) selectively removing the sacrificial material from the first set of trenches to expose the active layers; (ii) providing a charge-trapping layer in trenches over the exposed active layers; (iii) filling the first of trenches with a conductive material; and (iv) patterning and anisotropically etching the conductive material to provide pillars of conductive material.

The present invention is better understood upon consideration of the detailed description below in conjunction with the accompanying drawings.

DETAILED DESCRIPTION OF THE PREFERRED EMBODIMENTS

Figure 1A:
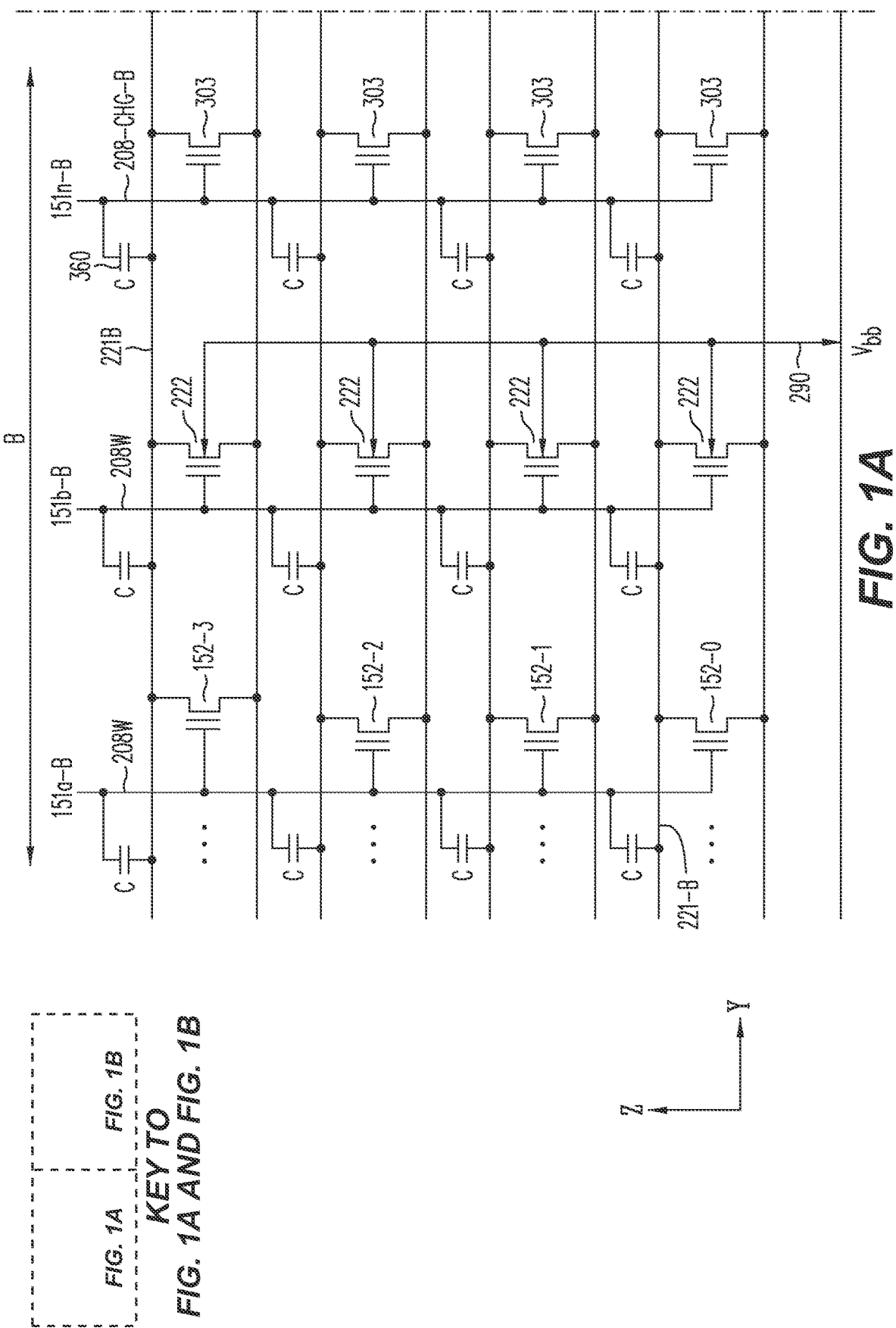
FIGS. 1A and 1B show circuit schematic in which NOR strings 202-0, 202-1, 202-2 and 202-3 are formed in a stack, one on top of each other and separated from each other by insulator layers (not shown), in accordance with one embodiment of the present invention.
Figure 1B:
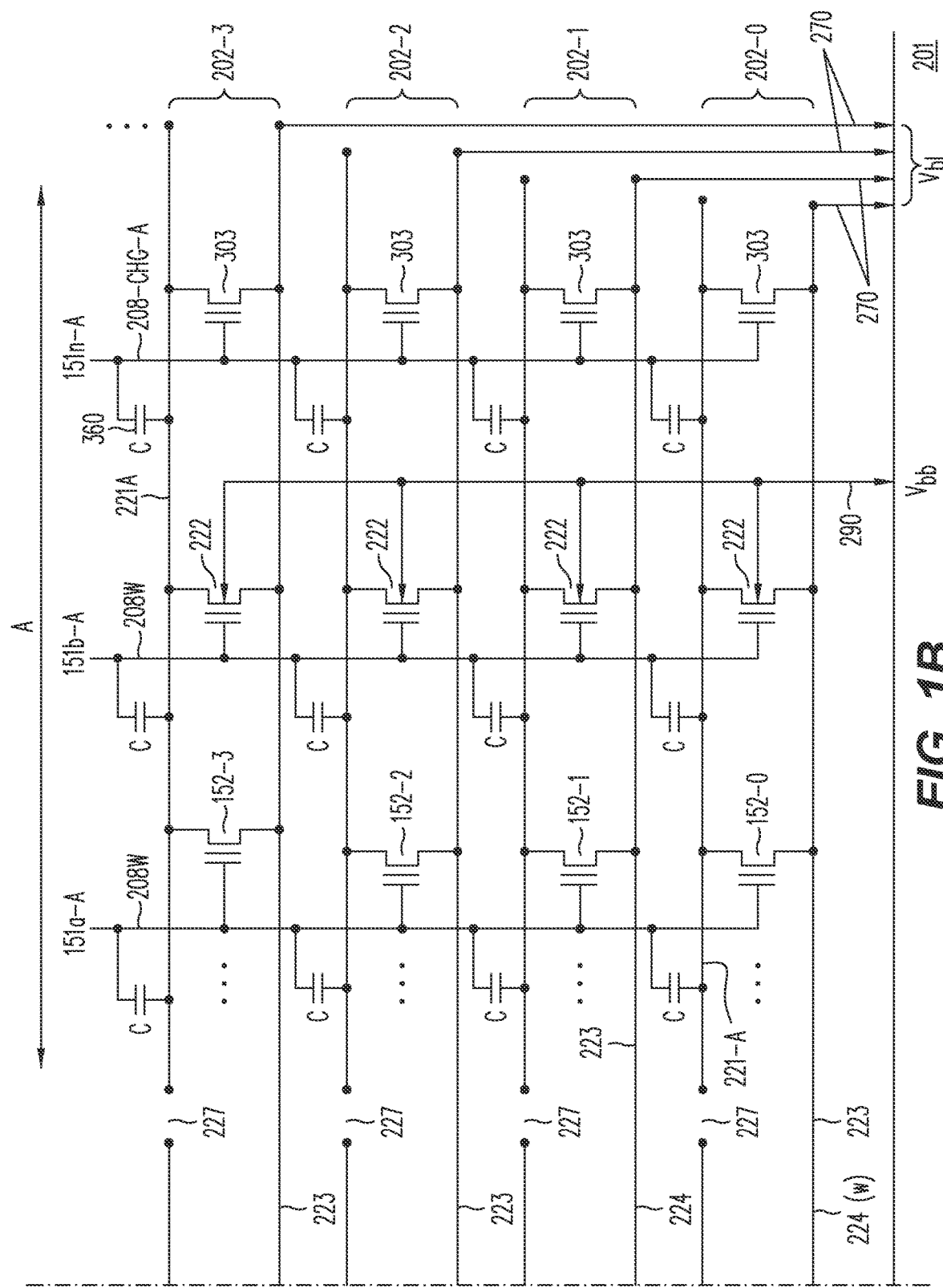

The present invention allows a memory array to be formed out of longer NOR strings, yet the memory array enjoys the benefits of a lesser leakage current as if it is formed out of much shorter NOR strings. FIG. 1 shows a circuit schematic in which NOR strings 202-0, 202-1, 202-2 and 202-3 are formed in a stack, one on top of each other and separated by an insulator (not shown), in accordance with one embodiment of the present invention. As shown in FIG. 1, each NOR string is provided a shared drain sublayer or bit-line 223 that is typically an N+ polysilicon layer that is preferably strapped by a narrow thin strip of low resistivity metallic interconnect 224 (e.g., Tungsten (W), Cobalt (Co) or another metallic material or a silicide). Each NOR string in FIG. 1 is also provided a shared source sublayer 221 (typically also N+ polysilicon), channel sublayer 222, typically p− polysilicon, and conductor word lines (e.g., word lines 151a and 151b). Of importance, shared bit-line sublayer 224 is continuous along the entire length of each NOR string, while electrical continuity in shared source sublayer 221 is interrupted at positions indicated by reference numeral 227, thereby dividing shared source sublayer 221 into a number of source line segments. Positions 227, where electrical connectivity in the shared source sublayer is interrupted, may be distributed at regular intervals. In some embodiments, as discussed in the Copending Non-provisional application, during reading, programming or erase operations, shared source sublayer 221 may be pre-charged from shared drain sublayer 223 through a TFT in the NOR string to a predetermined voltage. The voltage is then maintained by the parasitic capacitance as a virtual voltage source in shared source sublayer 223 during the remainder of the read, programming or erase operation.

In FIG. 1, positions 227 of NOR strings 202-0 to 202-3 are aligned, forming string segments A and B in each NOR string. Each such string segment may include, for example, 1,024 TFTs, so that eight string segments may be provided in a NOR string of 8,192 TFTs. All string segments in each NOR string are serviced by a single continuous, conducting shared bit-line 224. As shown in FIG. 1, each such string segment may incorporate pre-charge TFTs (e.g., pre-charge TFTs 208-CHG-A and 208-CHG-B). Such pre-charge TFTs may be a dedicated TFT in each string segment or alternatively, supplied by any TFT in the string segment. In these NOR strings, the pre-charge TFTs momentarily transfer the voltage on the bit line to their respective source line segment.

The segmented NOR string of the present invention is achieved by severing the source sublayer of each NOR string into individual source line segments, while retaining electrical continuity of the drain sublayer or bit line 224 sublayer along the entire length of the NOR string, spanning all string segments. Under such a scheme, during a read operation, only the source line segment that includes the addressed TFT contributes to the source-drain leakage current of the entire NOR string, while all other source line segments are pre-charged to the same voltage as that of the bit line, thereby eliminating their leakage current contributions. Although the segmentation requires an additional space to separate neighboring source line segments, the space can be a reasonably small area penalty. Another advantage of segmenting the source sublayer is achieved because the capacitance of each source line segment is correspondingly smaller than that of the full-string source capacitance, resulting in a lower power dissipation and a faster pre-charge.

Figure 2:
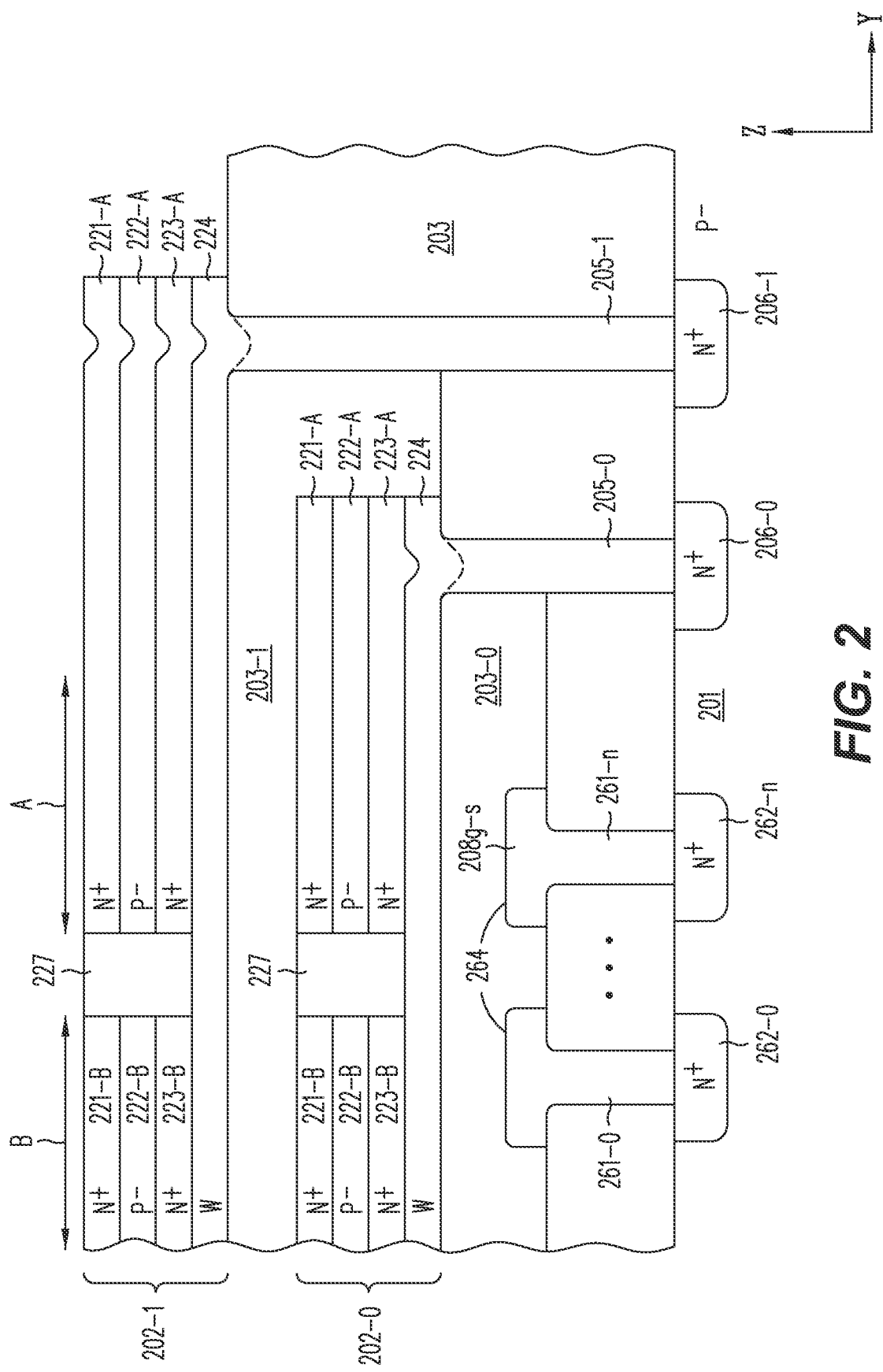
FIG. 2 shows a cross section of NOR strings 202-0 and 202-1 after a selective etch to create the source line segments, resulting in the two separate string segments A and B in each NOR string, in accordance with one embodiment of the present invention.

A selective-etch process may be applied to the NOR string structure to form the separations at positions 227 between adjacent source line segments. FIG. 2 shows a cross section of NOR strings 202-0 and 202-1 after the selective etch to create the source line segments, resulting in the two separate string segments A and B, in accordance with one embodiment of the present invention. The structure of FIG. 2 results from applying the selective etch on a variation of the structure shown in FIG. 2 of the Copending Non-provisional application. (Unlike the structure shown in Copending Non-provisional application, tungsten layer 224 is provided at the bottom—rather than the top—of the active layers forming NOR strings 202-1 and 202-2.)

As shown in FIG. 2, each of NOR strings 202-1 and 202-2 are formed out of stacked active layers, with each active layer including $N^+$ sublayer 221 (the common source sublayer), $P^-$ sublayer 222 (the channel sublayer), $N^+$ sublayer 223 (the common drain sublayer or bit line) and conducting layer 224 (e.g., tungsten). The selective-etching process cuts $N^+$ sublayer 221, $P^-$ sublayer 222, and $N^+$ sublayer 223, without etching into conducting layer 224. As conducting layer 224 is not etched, the segments 223-A and 223-B of $N^+$ sublayer 223 (i.e., the shared bit line) remains electrically connected.

FIG. 2 also shows that conductive layer 224 of each NOR string (e.g., NOR strings 202-0 and 202-1) are connected through respective buried contacts (e.g., buried contacts 205-0 and 205-1) to circuitry formed in semiconductor substrate 201. Such circuitry may include, for example, sense amplifiers and voltage sources. In addition, a system of global interconnect conductors 264 (e.g., global interconnect conductors 208g-s), which may be used to connect local word lines (not shown) along the NOR strings to circuitry in semiconductor substrate 201. As shown in FIG. 2, global interconnect conductors 208g-s are each connected by a buried contact (e.g., any of buried contact 261-0 to 261-n) to a corresponding (i.e., one of contacts 262-0 to 262-n) in semiconductor substrate 201.

Figure 3:
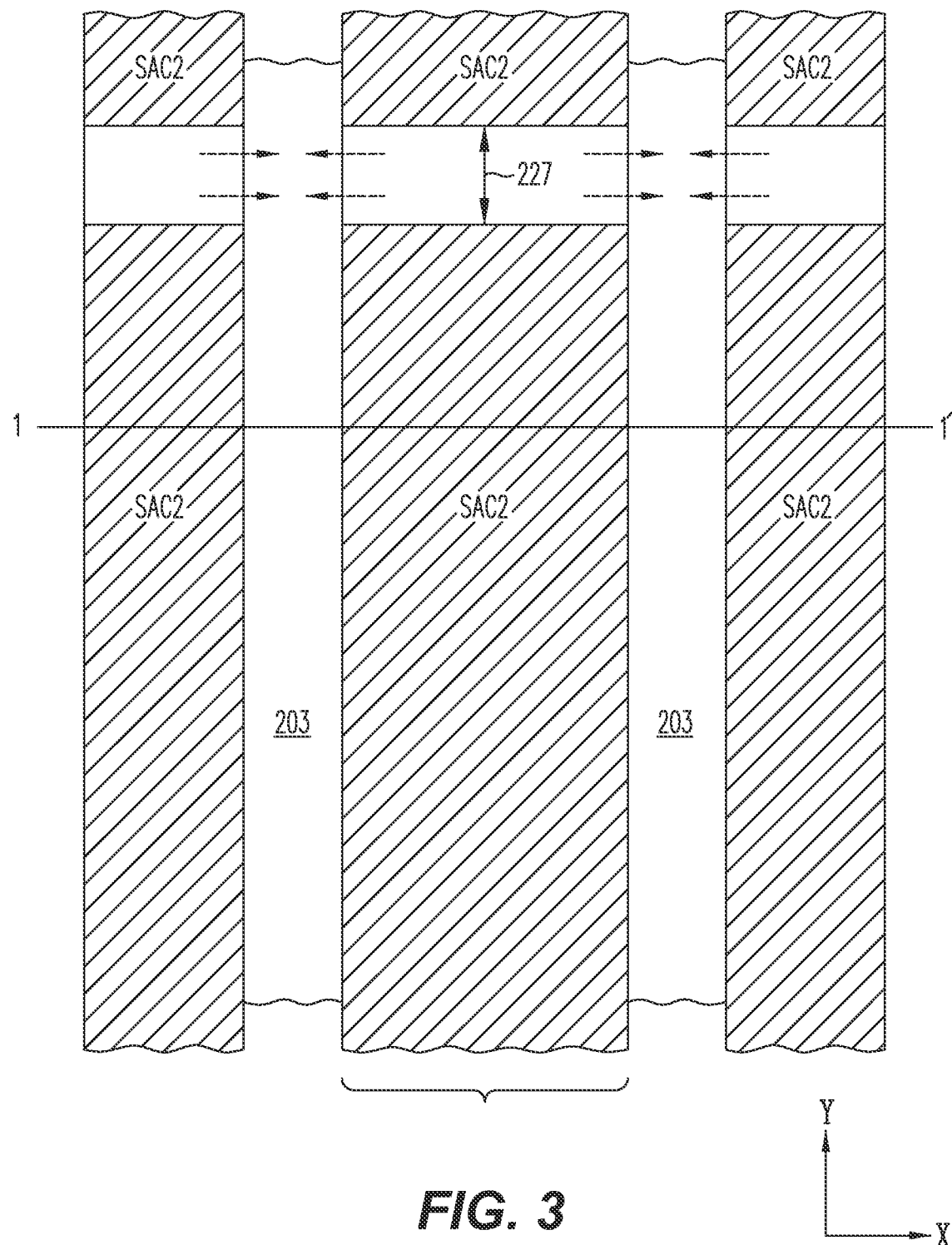
FIG. 3 illustrates a process that can be used to carry out a selective etch described herein, according to one embodiment of the present invention.

FIG. 3 illustrates a process that can perform the selective-etch described above. FIG. 3 is a top view of the NOR string array after the stacks of active layers are formed by patterning and anisotropically etching trenches running lengthwise along the Y-direction and in depth through the active layers. Initially, a number of active layers are formed, sublayer by sublayer, successively, with each active layer isolated from each other by an insulation layer. After the active layers are formed, insulator layer 203 is formed over the active layers. The resulting structure is then patterned and anisotropically etched. The resulting stacks of active layers that remain are the portions in FIG. 3 that are capped by insulation layer 203. The trenches are then filled using a sacrificial material SAC2, which may be, for example, a silicon oxide. A second set of trenches running lengthwise along the X-direction of width indicated in FIG. 3 by reference numeral 227 are etched all the way down the SAC2 material, thereby exposing the side edges of sublayers 221, 222, 223 and 224. A selective-etch then etches away the exposed semiconductor sublayers 221, 222, and 223, while leaving essentially in-tact conductive sublayers 224. Thereafter, the second set of trenches may be subsequently filled with an insulator, if desired. Sacrificial material SAC2 may then be selectively removed. Storage material (e.g., charge-trapping material) and local word line conductors are subsequently provided in these trenches resulting from removal of the SAC2 material.

The detailed description above is provided to illustrate specific embodiments of the present invention and is not intended to be limiting. Numerous variations and modifications within the scope of the present invention are possible. The present invention is set forth by the accompanying claims.

We claim:

1. A memory structure formed above a planar surface of a semiconductor substrate, comprising:
   a first semiconductor layer of a first conductivity type extending lengthwise along a first direction substantially parallel the planar surface;
   second and third semiconductor layers, each of a second conductivity type opposite the first conductivity type and each extending lengthwise along the first direction, wherein (i) the third semiconductor layer comprises first and second segments that are electrically isolated from each other, (ii) the first semiconductor layer, the second semiconductor layer and the first segment of the third semiconductor layer form a part of a first NOR memory string; (iii) the first semiconductor layer, the second semiconductor layer and the second segment of the third semiconductor layer form a part of a second NOR memory string; (iv) each NOR memory string comprises a plurality of storage transistors; and (v) for the storage transistors in each NOR memory string, the first semiconductor layer provides a channel region for each storage transistor, the second semiconductor layer provides a common bit line, and the corresponding segment of the third semiconductor layer in the NOR memory string provides a common source line;
   a charge-trapping layer; and
   a plurality of conductors, wherein, for each storage transistor in each NOR memory string, a portion of the charge-trapping layer provides a storage region for the storage transistor and the conductors provide a gate electrode.

2. The memory structure of claim 1, wherein the storage transistors of the first and the second NOR strings form a first active strip of semiconductor layers.

3. The memory structure of claim 2, further comprising third and fourth NOR memory strings configured substantially identically to the first and the second NOR memory strings, respectively, wherein (i) the storage transistors of the third and the fourth NOR memory strings form a second active strip of semiconductor layers, and (ii) the first active strip is formed above the second active strip in a first stack of active strips.

4. The memory structure of claim 2, further comprising third and fourth NOR memory strings configured substantially identically to the first and the second NOR memory strings, respectively, wherein (i) the storage transistors of the third and the fourth NOR memory strings form a second active strip of semiconductor layers, and (ii) the first active strip and the second active strip are, respectively, active strips in a first stack and a second stack of active strips, respectively, the first and the second stacks of active strips being separated from each other along a third direction that is substantially orthogonal to both the first and the second directions.

5. The memory structure of claim 4, wherein the first and the second stacks of active strips are separated from each other by a trench running lengthwise along the first direction.

6. The memory structure of claim 1, further comprising a conductive layer adjacent the second semiconductor layer.

7. The memory structure of claim 1, further comprising a conductive layer adjacent each segment of the third semiconductor layer.

8. The memory structure of claim 1, wherein circuitry supporting operations of each of the first and the second NOR memory strings are formed in the semiconductor substrate or at the planar surface of the semiconductor substrate, and wherein the second semiconductor layer is electrically coupled to the circuitry.

9. The memory structure of claim 1, wherein the first and second segments of the third semiconductor layer are separated from each other by an insulation material provided in a trench running along a third direction substantially orthogonal to the first direction.

10. The memory structure of claim 1 further comprising a first pre-charge transistor and a second pre-charge transistor provided to electrically connect, respectively, the common bit line of the first NOR memory string with the common source line of the first NOR memory string, and the common bit line of the second NOR memory string with the common source line of the second NOR memory string.

11. The memory structure of claim 1 wherein, during a read or programming operation on the first NOR memory string, the common bity line and the common source line of the second NOR memory string are held at substantially the same voltage.

* * * * *